United States Patent [19]

Petrescu-Prahova et al.

[11] 4,006,366
[45] Feb. 1, 1977

[54] SEMICONDUCTOR DEVICE WITH MEMORY EFFECT

[75] Inventors: Iulian Basarab Petrescu-Prahova; Paul Constantin Mihailovici; Cristian George Constantinescu, all of Bucharest, Romania

[73] Assignee: Institutul de Fizica, Bucharest, Romania

[22] Filed: May 9, 1975

[21] Appl. No.: 576,137

[30] Foreign Application Priority Data

Nov. 8, 1974 Romania .............................. 80464

[52] U.S. Cl. ................................. 307/238; 357/3; 357/16; 357/30; 357/34
[51] Int. Cl.² ...................................... H01L 29/205
[58] Field of Search .................... 357/3, 16, 64, 30; 307/238

[56] References Cited

UNITED STATES PATENTS

| | | |
|---|---|---|
| 3,467,896 | 9/1969 | Kroemer .............................. 357/3 |
| 3,780,359 | 12/1973 | Dumke et al. ........................ 357/16 |
| 3,821,784 | 6/1974 | Heald et al. .......................... 357/63 |
| 3,927,385 | 12/1975 | Pratt, Jr. .............................. 357/16 |

OTHER PUBLICATIONS

Milnes et al., Heterojunctions and Metal–Semiconductor Junctions, Academic Press, NY, 1972, p. 145.
Hovel, Def. Pub. of Ser. No. 441,712, filed 4-1972, Def. Pub. No. T934,008.

*Primary Examiner*—William D. Larkins
*Attorney, Agent, or Firm*—Karl F. Ross; Herbert Dubno

[57] ABSTRACT

A semiconductor device including a heterojunction between an indirect semiconductor and a direct semiconductor of lower band gap which exhibits a notch-spike direct-indirect structure and circuit means for obtaining a current-voltage characteristic with two branches or limbs and switching from one branch to the other controlled by electron population in the direct notch.

43 Claims, 15 Drawing Figures

4,006,366

SEMICONDUCTOR DEVICE WITH MEMORY EFFECT

FIELD OF THE INVENTION

This invention relates to high-speed switching semiconductor devices with a memory effect which can be used in memory cells in industrial electronics and computers.

BACKGROUND OF THE INVENTION

There are known many types of switching semiconductor devices as, for example, bipolar transistors, MOS transistors, tunnel diodes, thyristors, amorphous switches, which are used in memory cells. A memory cell is characterized by the fact that it has two stable states, ON and OFF. These states differ by the value of one or more characteristic parameters, this difference being transmitted to the output. The memory cell remains in a determined state even after the triggering signal has ceased, the state parameters having a hysteresis characteristic as a function of the triggering signal for changing states.

Switching time, i.e. the time for changing from one state to the other and the time for triggering to the initial state, is an essential characteristic of the above-mentioned devices and of the memory cells which include them. The switching time is determined by the physical principle of operation and by technological limits established by the device structure and parameters of the materials used.

Among the above-mentioned devices, the bipolar transistor, the MOS transistor and the thyristor can be treated as quadripoles, the triggering signal being applied to the input which is isolated from the output due to presence of a control electrode. The tunnel diode and the ovistor are dipoles and have no control electrode. Switching devices with a control electrode, as compared with those without a control electrode, have the advantage that they need a lower triggering power and that they provide a better isolation (separation) between the input and the output.

Excepting the amorphous switch, which has its own hysteresis loop, the other switching devices have the disadvantage that they can be used in memory cells only in connection with other circuit components.

Also, the described prior devices have the disadvantage that they are characterized by an electrical coupling between the input and the output, due to the electrical interaction among their parts.

All the above-mentioned devices have the disadvantage that they do not fulfill simultaneously all of the requirements needed for a good switching device to be used in a memory cell, namely: an intrinsic hysteresis loop, short switching time, control electrode, and electrical isolation (separation) between the input and the output.

The present invention avoids the above-mentioned disadvantage providing a new class of semiconductor devices which has a basic structure made of a semiconductor material body containing a p-n heterojunction between two p-type and n-type regions; the n-type region is made of an indirect semiconductor material which has an indirect forbidden band gap larger than the direct forbidden band gap and also larger than the indirect band gap of the direct semiconductor material of which the p-type region is made.

The heterojunction exhibits a notch-spike direct-indirect structure. In this heterojunction two mechanisms for electron flow from the n-type region to the p-type region are possible, namely, a slow and a fast flow.

The switching from the slow mechanism to the fast one is done by avalanche filling of the direct notch due to the enhancement of electron-electron interaction. This interaction occurs between indirect electrons injected over the indirect spike and the direct electrons which exist already in the direct notch. The avalanche filling is produced when a critical value of the notch electron population is exceeded.

The switching from the fast mechanism to the slow one is done by emptying of the direct notch due to attenuation of the electron-electron interaction. This interaction takes place between indirect electrons injected over the indirect spike and direct electrons which already exist in the direct notch. The emptying is brought about when the notch electron population decreases below a critical value.

The basic structure is provided with circuit means in order to bias with a variable external voltage the p-n heterojunction coupled with a load. A current-voltage characteristic is produced which has two branches or limbs, the OFF branch and the ON branch. The operating point is on the OFF branch of the current-voltage characteristic. When a critical point ON, determined by a critical voltage level ON and by a critical current level ON is exceeded, these levels being correlated with an increase of the notch electron population over a critical value, the device switches on the ON branch of the current-voltage characteristic.

If the operating point is on the ON branch of the current-voltage characteristic and the bias is decreased, when a critical point OFF, determined by a critical voltage level OFF and a critical current level OFF, is exceeded, these latter levels being correlated with a decrease of notch electron population below a critical value, the device switches on the OFF branch of the current-voltage characteristic. A hysteresis loop is thus obtained which is defined by the two branches of the current-voltage characteristic and by two load lines which pass through the ON and OFF critical points.

The device having this basic structure and employing simple circuitry can be used as a bistable unit with a memory effect.

Starting from the basic bistable memory-effect structure, devices controlled by a control electrode or by optical means, can be made.

The new devices can optically display ON and OFF states. When coupled with photodetectors they permit electrical isolation of the input from the output.

The bistable memory-effect device, with control electrode, can be used for the generation of electromagnetic oscillations.

The devices belonging to the above described class have switching times determined by fast intrinsic processes.

BRIEF DESCRIPTION OF THE DRAWING

Other features of the devices described in this invention will become apparent from the detailed description which follows, reference being made to the drawing in which.

SPECIFIC DESCRIPTION

The semiconductor device with a memory effect, according to the present invention, is based on a new operating principle.

Figure 1:
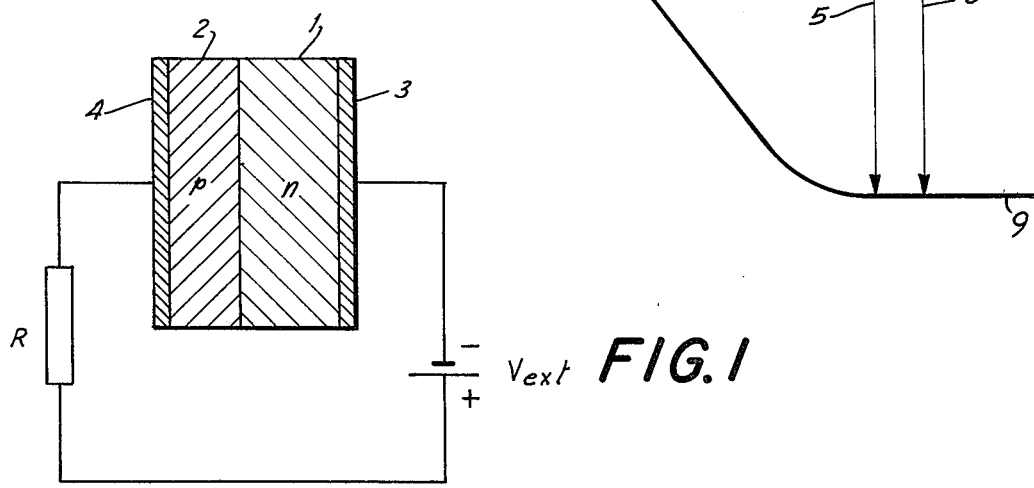
FIG. 1 is a cross-section through the basic device and circuit means for producing the described current-voltage characteristic.

FIG. 1 shows the basic structure of the device, which is made of a p-n heterojunction between an n-type indirect semiconductor 1 and a p-type direct semiconductor 2, having an ohmic contact 3 at the n-side and an ohmic contact 4 at the p-side, these contacts permitting current flow when an external bias $V_{ext}$ is applied across the device coupled with a load R.

Figure 2:
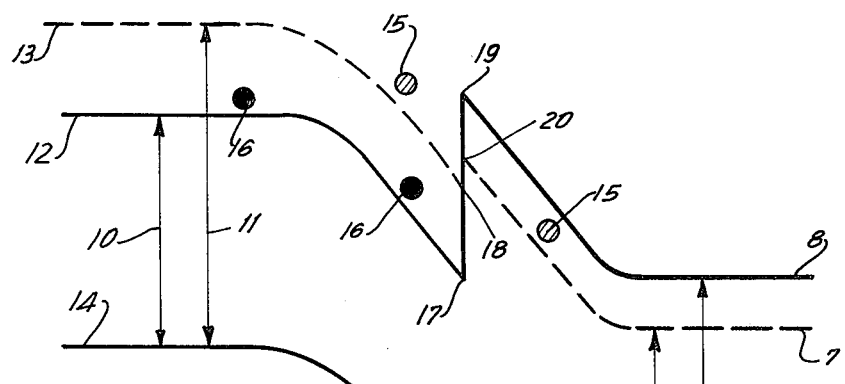
FIG. 2 is an energy-profile diagram of the energy bands in the p-n heterojunction.

In FIG. 2 the profile of the energy bands of the system is shown. The n-type semiconductor has an indirect forbidden band gap 5, a direct forbidden band gap 6, an indirect conduction band minimum 7, a direct conduction band minimum 8, and a valence band maximum 9, and the p-type semiconductor has a direct forbidden band gap 10, an indirect forbidden band gap 11, a direct conduction band minimum 12, an indirect conduction band minimum 13 and a valence band maximum 14.

This system has the following properties: the indirect forbidden band gap 5 of the n-type semiconductor is larger than the direct forbidden band gap 10 and than the indirect forbidden band gap 11, both of the p-type semiconductor, and the indirect minima 7 and 13 of the indirect conduction bands have the same localization in the Brillouin zone for both semiconductors.

Figure 3:
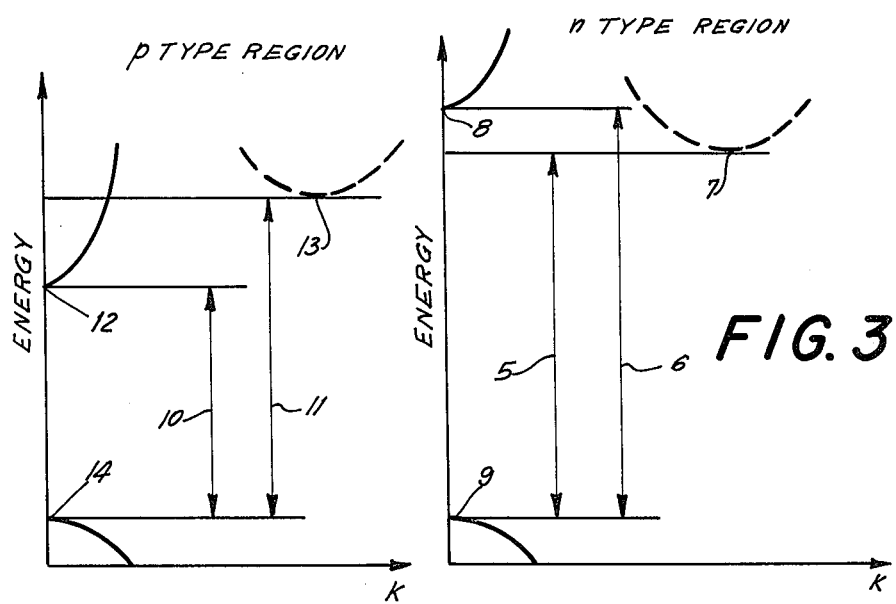
FIG. 3 shows diagrammatically the band structure of the p type region and of the n type region in the k space.

In FIG. 3 the band structure of both p-type and n-type semiconductors in the Brillouin zone is shown, i.e. the dependence of electron states energy of the conduction band and of the valence band on the electron wave vector k.

In the indirect minima there are electrons 15, which hereinafter are called indirect electrons, and in the direct minima there are electrons 16, which hereinafter are called direct electrons. The electrons 15 of the indirect minima 7 and 13 of the indirect conduction bands of both semiconductors have a greater effective mass and, consequently, a smaller mobility than those of the electrons 16 of the direct band minima 8 and 12 of both semiconductors direct conduction band. The p-type and n-type semiconductors doping levels have close values.

The transit region from one semiconductor to the other is narrow and does not exhibit an appreciable number of interface states. The valence band maxima 9 and 14 do not present an appreciable discontinuity at the junction between p-type and n-type semiconductors, so that the differences between forbidden band gaps of both semiconductors appear as discontinuities of conduction band minima namely: a discontinuity 17-19 for the direct conduction bands and a discontinuity 18-20 for the indirect conduction bands.

Under these circumstances the direct conduction band minima 8 and 12 and indirect conduction band minima 7 and 13 yield a structure consisting of a direct notch 17, an indirect notch 18, a direct spike 19 and an indirect spike 20, hereinafter termed a notch-spike direct-indirect structure.

The notches 17 and 18 are superposed and belong to the p-type semiconductor. The notch 17 produced by the direct minimum of the conduction band contains a large enough number of states for the direct electrons and this is practically accomplished by by suitable choice of the 17-19 discontinuity and of the doping level, parameters which determine both the depth and the width of the notch.

Also, the notch should not be wider than the diffusion length for indirect electrons 15; this diffusion length is determined by the electron mobility and by their indirect-direct transfer time due to electron-lattice interaction. Nevertheless, in order to obtain a wide enough notch and also in order to avoid spike tunneling, a low value for the doping levels, under $10^{16}$ cm$^{-3}$, is needed. Due to the close values of the doping levels of both regions, the notch-spike direct-indirect structure is situated approximately in the middle of space charge region, the notch states being empty when no external voltage is applied to the device.

The 18-20 discontinuity between the both semiconductors indirect minima is smaller than the discontinuity 17-19 between the direct minima.

Figure 4:
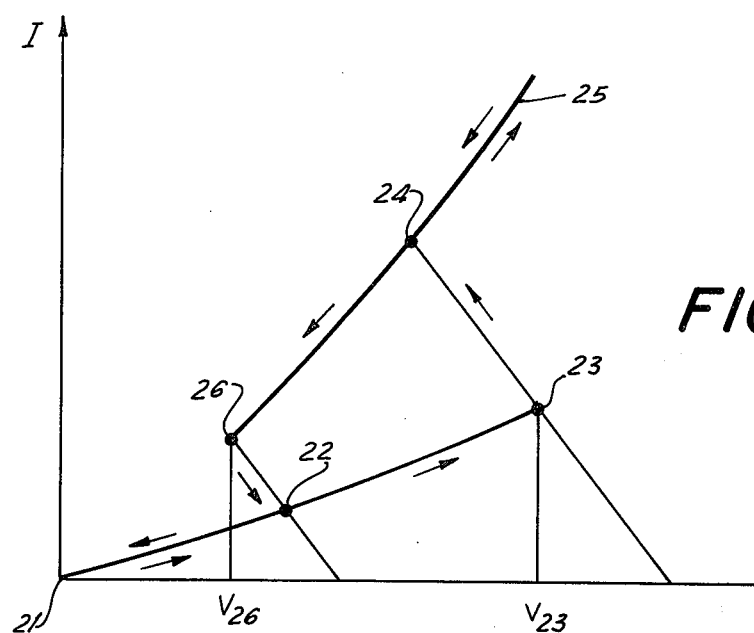
FIG. 4 is a graph of the current-voltage characteristic of the device.

When a direct voltage $V_{ext}$ is applied to the device coupled with the load R, as in FIG. 1, one obtains a current-voltage characteristic as presented in FIG. 4. At a voltage V applied on the device, through the heterojunction flows a current I. The I dependence on V presents a hysteresis effect. As the voltage increases from the zero value, the current increases on a branch 21-22-23 of the characteristic. Hereinafter the branch 21-22-23 is identified as the OFF branch. In a critical point 22, a jump occurs from the OFF branch to a branch 26–24–25, on a load line 23–24. Hereinafter the branch 26–24–25 is identified as the ON branch. The intersection of the load line 23–24 with the ON branch is a point 24. As the applied voltage increases further, the current increases following the ON branch. When the voltage decreases, the current decreases on the ON branch and in a critical point 26 a jump occurs to the OFF branch of the characteristic, on the load line 26–22. The intersection of the load line 26–22 with the OFF branch of the characteristic is a point 22. When the voltage applied to the device decreases to zero the current decreases to zero following the OFF branch.

Figure 5:
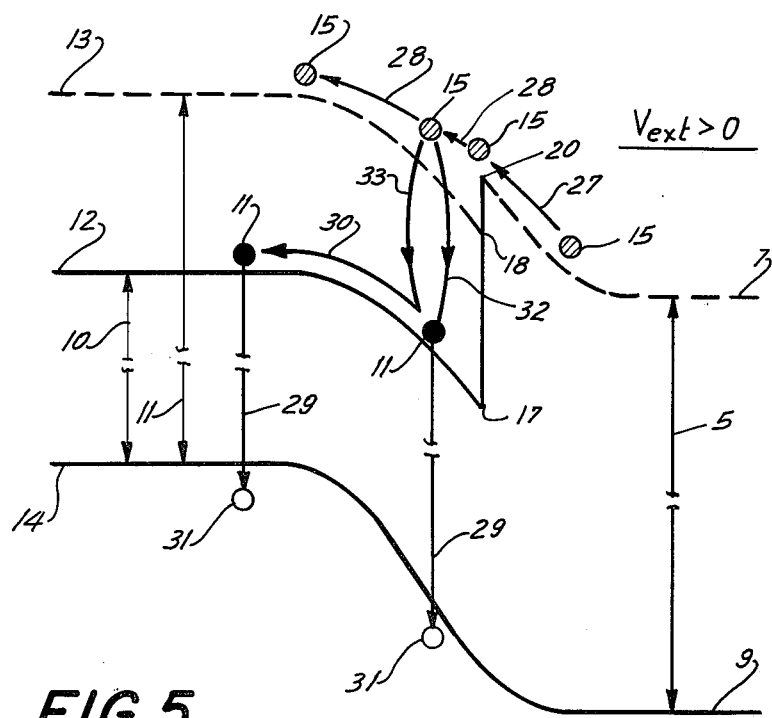
FIG. 5 is an energy-profile diagram of the energy bands when an external bias is applied showing the different processes which occur in the p-n heterojunction.

The physical processes which determine this characteristic are illustrated in FIG. 5. The OFF branch of the current-voltage characteristic is determined by an injection process 27 of the indirect electrons 15 over the indirect spike 20, followed by a diffusion process 28 and transfer processes in the direct notch 17. Next, the direct electrons leave the notch by a recombination process 29 and by a diffusion process 30 followed by a recombination process 29' outside the notch. The recombination processes 29 and 29' involve holes 31 of the p-type region. The transfer of indirect electrons is possible by a process 32 of electron-lattice interaction and by a process 33 of electron-electron interaction. The electron-electron interaction process 33 takes place between the indirect electrons injected over the spike and direct electrons already existing in the notch. For small values of notch electron population the electron-electron interaction mechanism is weaker than the electron-lattice interaction mechanism but becomes prevalent at high values of notch electron population.

For every value of the applied voltage, the notch electron population has a steady-state value determined by the equilibrium between the notch filling processes 32 and 33 and the emptying process 29 and 30. The steady-state population value increases with the applied voltage and, at the same time, increases the preponderance of the electron-electron interaction over the electron-lattice interaction. When a critical value of the applied voltage $V_{23}$ and a critical value of the current $I_{23}$, values which correspond to the critical point 23, are reached, the electron population in the direct notch reaches a critical value at which the electron-electron interaction process becomes prevalent and the equilibrium between the filling and emptying processes is interrupted. As the notch population value increases the electron-electron interaction is further increased and causes a further increase of the notch population, etc., i.e. the phenomenon assumes an avalanche behavior. This corresponds to the jump 23–24 of the operating point from the OFF branch to the ON branch of the current-voltage characteristic shown in FIG. 4.

The dynamic equilibrium between the filling and emptying processes is reestablished at a new value of the notch population as a consequence of the enhancement of the emptying processes. The lower limit of the switching time is so determined by indirect-direct transfer processes.

When the applied voltage further increases, the operating point moves along the ON branch of the current-voltage characteristic.

When the applied voltage decreases and the operating point reaches the point 24 of FIG. 4, the notch electron population has a large enough value so that the prevalent transfer mechanism is due to electron-electron interaction. This process prevails until the applied voltage decreases to a critical value $V_{26}$ and the current decreases to a critical value $I_{26}$, values corresponding to the critical point 26. At the critical point 26 the electron-electron interaction mechanism ceases to be prevalent and the equilibrium between the filling processes and the emptying ones is, interrupted. The notch population value decreases, this attenuates the intensity of the electron-electron interaction, which further decreases the notch population value, etc. This corresponds to the jump 26–22 of the operating point from the ON branch to the OFF branch of the current-voltage characteristic in FIG. 4.

Figure 6:
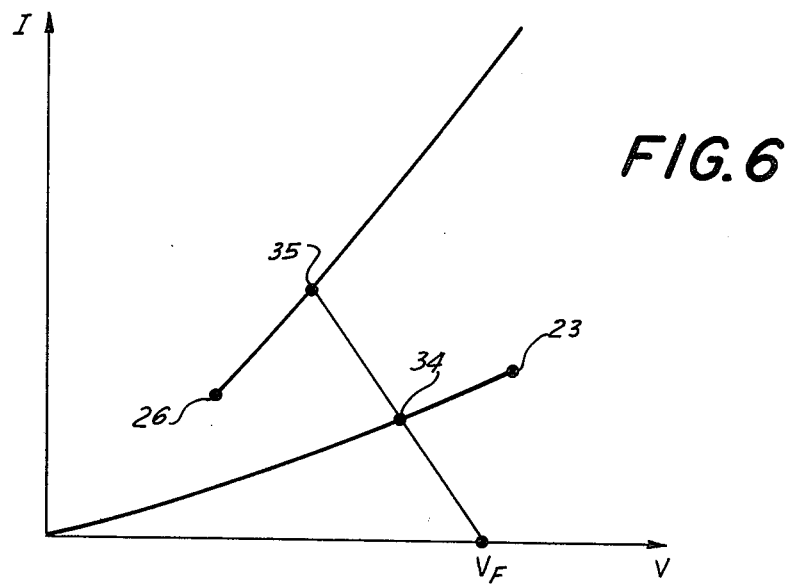
FIG. 6 is a graph of the current voltage characteristic of the device which assures its operation as a bistable memory- effect unit.

The device coupled with the load as described above has properties such that, when a fixed external voltage $V_F$ is applied so that the load line passes between the two critical points 23 and 26, it can work in two stable states, the state OFF corresponding to an operating point 34 and the state ON corresponding to an operating point 35. These operating points are determined by the intersection of the load line with the OFF or with the ON branch of the current-voltage characteristic presented in FIG. 6.

Figure 7:
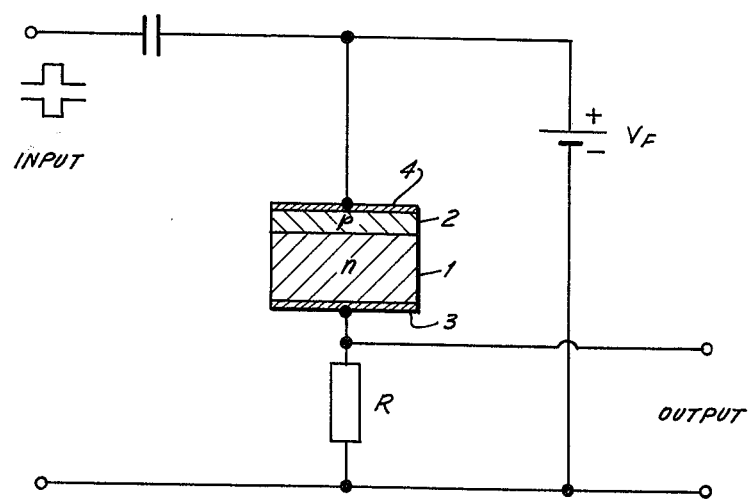
FIG. 7 is a diagram of one possible circuit connection of the basic device as a bistable memory-effect unit.

The states of the device are transmitted to the output as two distinct values of voltage drop on the load, as in FIG. 7. The command for switching the device from one state to the other can be performed as in FIG. 7 by superposing on the fixed biasing voltage $V_F$, applied on the device coupled with a load, input pulses of convenient polarity and amplitude. The pulses should exceed the critical point ON 23 for the switching OFF-ON, or the critical point OFF 26 for the switching ON-OFF. In this way a bistable memory-effect device results.

From the description of the basic device, the role of the value of direct electron population in the direct notch played in the switching effects from one branch of the current-voltage characteristic to the other will be clear. The value of the notch electron population can be modified independently of the main current I flow mechanism through the p-n heterojunction, using other means for injecting electrons in the notch.

Figure 8:
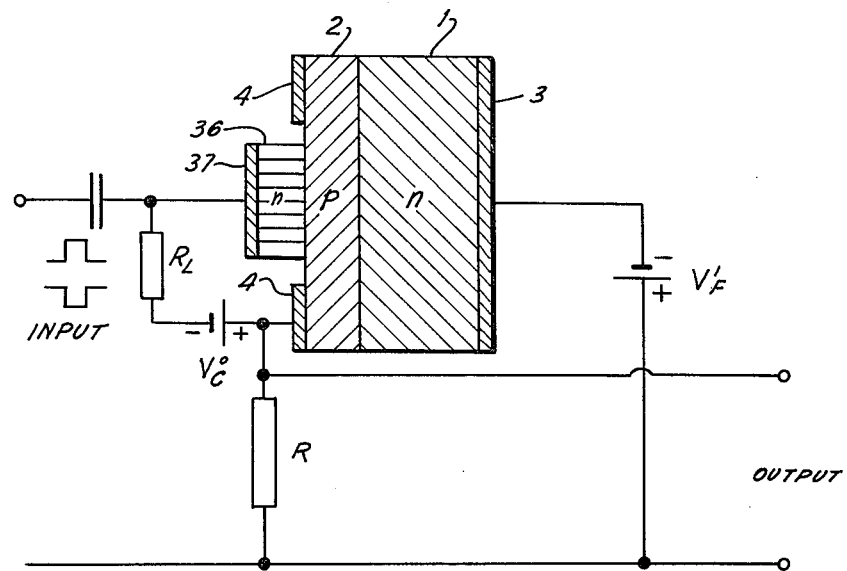
FIG. 8 is a circuit diagram of the bistable memory-effect device, with control electrode, in another circuit connection.

In FIG. 8 we show the structure of a device derived from the basis device, in which the notch electron population can be controlled by electron injection employing a p-n junction. The p-n junction is made of a n-type region 36 and of the p-type region 2, which is common for the p-n junction and for the p-n heterojunction.

The structure presented in FIG. 8 is so made that the width of the common region, hereinafter called the base, is narrower that the diffusion length of the direct electrons. The p-n junction has a contact 4 for the p-type region and a contact 37 n-type region.

For current flow, the p-n junction is forwardly biased with a constant voltage $V_c^o$ on which are superposed voltage input pulses of convenient polarity and amplitude.

Figure 9:
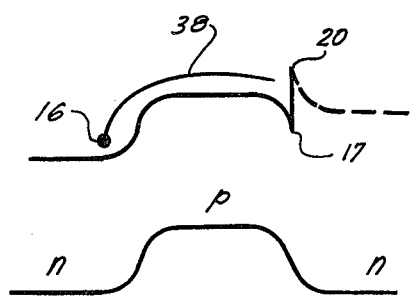
FIG. 9 is an energyprofile diagram of the energy bands for the bistable memory-effect device, with control electrode, in the case where notch population is controlled by a control current.

FIG. 9 shows how the notch population value is controlled by an injection process 38 from the p-n junction through the base. The electrons are stopped by the direct barrier 17–19, so that one can produce with a small control current $I_c$ through the p-n junction the same notch population as substantially greater values of main current I through the heterojunction. For a value $I_c^o$ of the control current, the critical values of notch electron population are reached at smaller values of the applied voltage on the p-n heterojunction compared with the case $I_c=0$.

Figure 10:
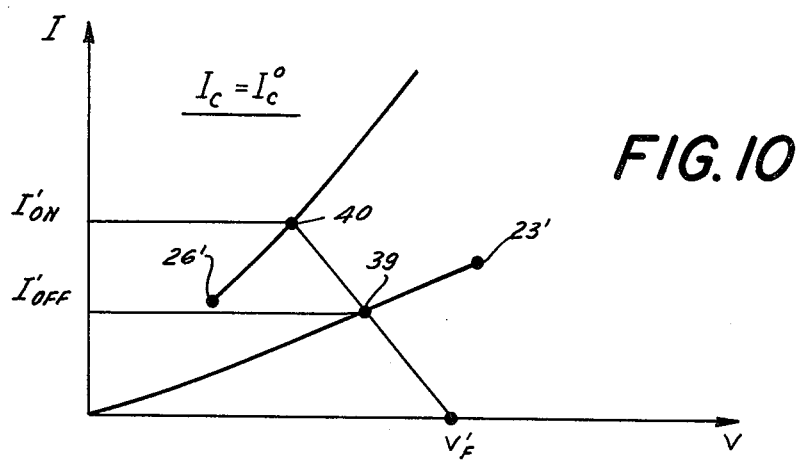
FIG. 10 is a graph of the current-voltage characteristic of the bistable memory-effect device, with control electrode, for a value $I_c^o$ of the control current.

In FIG. 10 the current-voltage characteristic for a value $I_c^o$ of the control current is shown, presenting a critical point ON 23' and a critical point OFF 26'. When the load line, determined by a fixed bias $V_F'$ passes between critical point 23' and 26', the device can be found in two stable states OFF and ON, corresponding to operating points 39 and 40, these points being the intersections of the load line with the OFF branch or with the ON branch of the current-voltage characteristic respectively. A value $I_{OFF}$ of the heterojunction current I corresponds to the OFF state and a value $I_{ON}$ of this current corresponds to the ON state.

Figure 11:
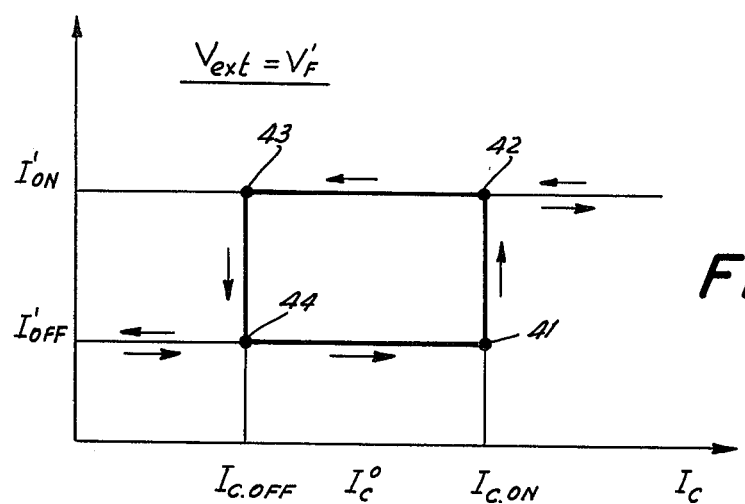
FIG. 11 is a diagram of the hysteresis loop for the p-n heterojunction current I as a function of the control current $I_c$.

The switching of the device from one state to the other by changing the value of the control current $I_c$ is illustrated in FIG. 11. When a value $I_c$, ON is reached, changing sufficiently the notch population, the device switches from a critical point 41 to a point 42, i.e. from an OFF state, corresponding to a curve 44–41, to an ON state, corresponding to a curve 42–43. When the control current decreases and a critical value $I_{c,OFF}$ is reached, sufficiently changing the notch population, the device switches from a critical point 43 to a point 44, i.e. from the ON state to the OFF state. In this way a practically rectangular I–$I_c$ hysteresis loop is obtained. A bistable memory-effect device, with a control electrode, is thereby obtained.

Figure 12:
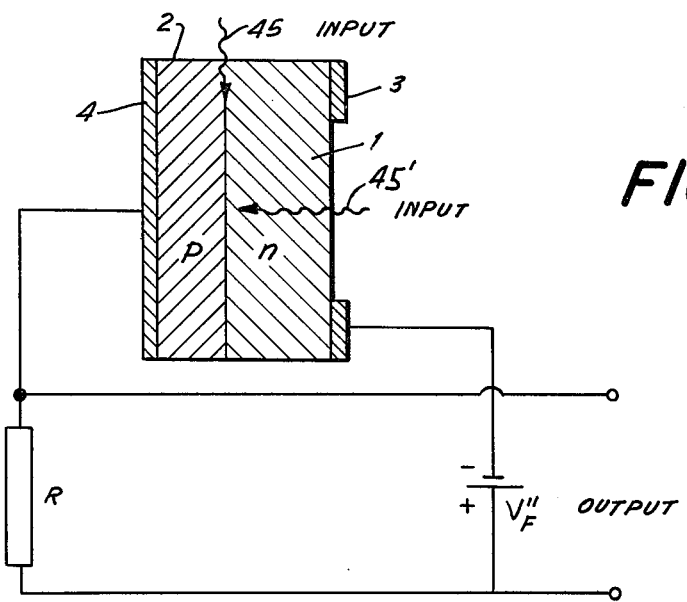
FIG. 12 is a view of the bistable memory-effect device as optically controlled, in a possible circuit connection.

In FIG. 12 another possibility for independently increase the value of the direct notch population is shown. This arrangement employs electron injection by internal photoeffect, an additional p-n junction for the control of the basic structure being no longer needed.

As shown in FIG. 12, the command role is played by a luminous flux 45 Φ, of convenient wavelength. The electrons optically generated by a luminous flux of a value Φ, modifiex the direct notch population which permits reaching the critical values of the notch population at lower values of the heterojunction biasing voltage, compared with the case Φ = 0.

Figure 13:
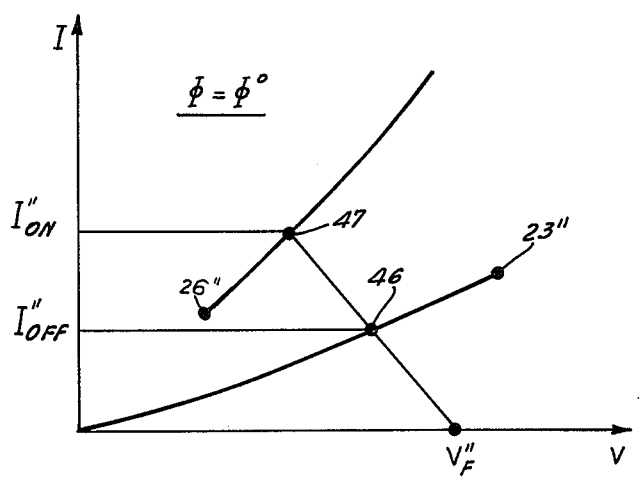
FIG. 13 is a graph of the current-voltage characteristic of the optically controlled bistable memory-effect device, for a value $I^o$ of the control luminous flux.

The current-voltage characteristic, shown in FIG. 13 has a critical point ON 23" and a critical point OFF 26". When the load line determined by a fixed bias $V_F''$ passes between critical points 23" and 26", the device can be found in two stable states, an OFF state, corresponding to the operating point 46, and an ON state, corresponding to the operating point 47. A value $I_{OFF}''$ of the heterojunction current I corresponds to the OFF state and a value $I_{ON}''$ of this current corresponds to the ON state.

Figure 14:
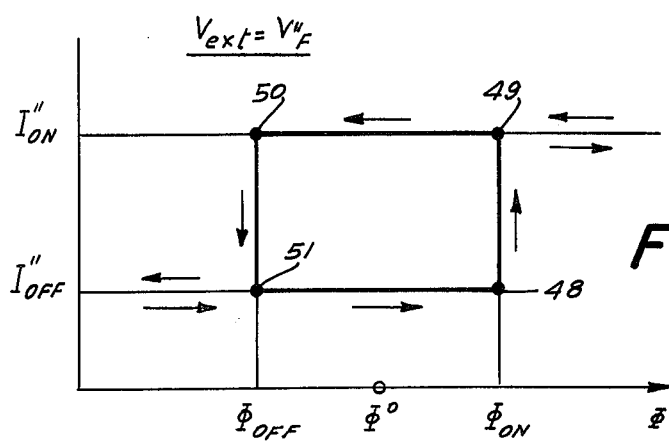
FIG. 14 is a diagram of the hysteresis loop of the p-n heterojunction current I as a function of the control luminous flux I.

The device switching from one state to the other by changing the value of the control flux Φ is illustrated in FIG. 14. When a critical value $\Phi_{ON}$ is reached, sufficiently changing the notch-electron population, the device switches from a critical point 48 to a point 49, i.e. from an OFF state, corresponding to a curve 51–48, to an ON state, corresponding to a curve 49–50. When the control flux decreases and a critical value $\Phi_{OFF}$ is reached, sufficiently changing the notch-electron population, the device switches from a critical point 50 to a point 51, i.e. from the ON state to the OFF state. In this way a practically rectangular I-Φ hysteresis loop is obtained. A bistable memory-effect optically controlled device is so produced.

The efficiency of the optical control is significantly increased if, instead of an illumination parallel to the junction plane, a luminous flux 45' normally incident on the n-type region of the heterojunction is used. The wavelength of the incident radiation should be so that the photon energy is greater than the p-type direct material forbidden band gap and smaller than the n-type indirect material forbidden band gap. In these circumstances, radiation is absorbed only in the notch region, the n-type region exhibiting a window effect.

In the operating mechanism of the basic bistable memory-effect device, bistable memory effect device, with control electrode, and the bistable memory-effect optically controlled device, the electrons which do not arrive at the base contact 4, recombine with holes in the region 2 made of the p-type direct semiconductor.

Figure 15:
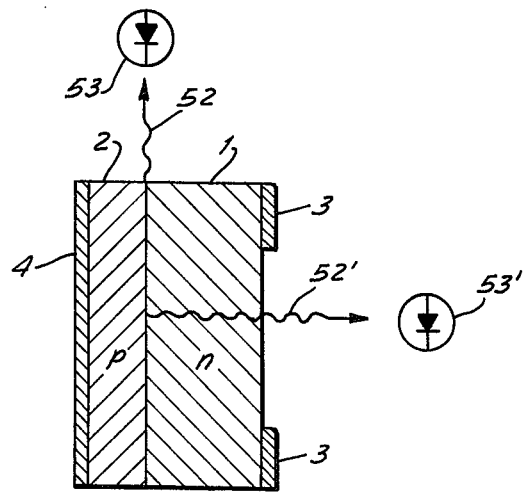
FIG. 15 is a diagram illustrating the possibility of reading the ON and OFF states of a device belonging to this class employing optical coupling with a photodetector.

It is known that for this p-type of semiconductor the radiative recombination efficiency is fairly high. Thus it is possible to correlate the OFF and the ON states with the intensity of the radiation emitted by the devices due to radiative recombination in the base region. An emitted radiation flux 52, as shown in FIG. 15, which has two intensity values $\phi_{ON}$ and $\phi_{OFF}$, corresponding to the ON and OFF states of the device, can be detected using a proper detector 53, the output signal being extracted from the detector circuit. In this way a bistable memory-effect device provided with electrical isolation between the input and the output is produced. The n-type region window effect can be used again, obtaining a more intense outer radiation flux 52'. This flux is detected by a detector 53'. The ON and OFF states of the above described devices can be visually observed if the wavelength of the emitted radiation is within the visible region of the spectrum. In this case the receiver 53 or 53' is replaced by the human eye.

In a convenient configuration of the outer circuit which assures proper feed-back using the control electrode, the bistable memory-effect device with the control electrode can generate electromagnetic oscillations whose maximum theoretical frequency is determined by the indirect-direct transfer times.

The indirect-direct electron interaction has an important role in the above described processes. This interaction occurs between free or indirect notch localized indirect electrons and direct electrons localized in the direct notch. The indirect electron-direct electron interaction which can imply a significant quasiimpulse transfer is favored by the mixing of both conduction band wave functions which describes the two types of localized states. The mixing takes place when the energy difference between direct and indirect conduction band minima of the p-type semiconductor is reasonably small. The above described operating principle is also possible when the indirect conduction bands is taken over by a discontinuity between the valence bands. In this case the mixing of the wave functions takes place only for localized states in the direct notch.

The structure and the operating principle of the devices which form the object of the present invention have been described in detail above. Below a method of producing the basic structure will be described.

For the device fabrication, the semiconductors belonging to those semiconductor families $III_x'III_{1-x}V$ or $III\ V_xV'_{1-x}$ which, as a function of composition $x$, can be either direct or indirect are of special interest. These semiconductors have two conduction band minima, one direct and another one indirect. The direct semiconductors of the above mentioned families have a direct minimum which is at a lower energy level than the indirect minimum. The situation is reversed for indirect semiconductors.

In the particular case which will be described in what follows, the heterojunction has been fabricated by the method of liquid phase epitaxy by growing on a p-type GaAs substrate a p-type $Al_xGa_{1-x}As$ layer and an n-type $Al_yGa_{1-y}As$ layer. The p layer has a composition $x = 0.32$ and the n layer has a composition of about $y = 0.50$. It is known that semiconductors of the (Al-Ga)As family have two conduction band minima, one in the $\Gamma$ point of the Brillouin zone, termed direct, and another in the X point of the Brillouin zone, termed indirect. The energies of the $\Gamma$ and X minima depend differently on the composition $x$, so while GaAs in a direct semiconductor AlAs is an indirect semiconductor. The crossing point direct-indirect occurs at the composition $x = 0.37$.

In our particular case the value of the forbidden direct band gap of the p-type semiconductor is 1.89 eV, the value of the forbidden indirect band gap of the n-type semiconductor is 1.94 eV and the value of the indirect forbidden band gap of the n-type semiconductor is 2.02 eV.

The (AlGa)As system presents neither an appreciable discontinuity in the valence band, nor an appreciable number of interface states at the junction between two semiconductors belonging to this system. The doping levels of both semiconductors have close values in the $10^{15}$ to $10^{16}$ cm$^{-3}$ range. Zn and Te are used as dopants. The ohmic contacts are made by vacuum evaporation of an Au-Zn alloy on the p side and, through a mask, of a Ge-Ni-Au alloy on the n side. The devices are mounted on TO-18 headers.

The device has a current-voltage characteristic which exhibits a hysteresis loop. The critical voltage ON is 2.3 V and the critical voltage OFF is 1.9 V. The forbidden band gap of the p type material, where radiative recombination occurs, is large enough so that the device emits red light when in the ON state. Due to the window effect of the n-layer the intensity of the emitted light is substantially higher when observed normally on the junction plane than when observed in the junction plane.

We claim:

1. A semiconductor device with memory effect comprising:
a semiconductor material body containing a p-n heterojunction between two p-type and n-type regions; the n-type region is made of a n-type indirect gap material and the p-type region is made of a p-type direct gap material; the indirect gap of said n-type material is wider than that indirect gap of said p-type material at the corresponding position in wavevector space; the indirect gap conduction band minima in said n-type material are higher in energy than the corresponding indirect gap conduction band minima in said p-type material, at said p-n heterojunction; aid heterojunction exhibits a spike-notch structure in the indirect gap conduction band minima and a spike-notch structure in the direct gap conduction band minima; said heterojunction affording two mechanisms for electron flow from the n-type region to the p-type region including a slow mechanism and a fast mechanism and effecting switching from said slow mechanism and said fast mechanism, by avalanche filling of the direct notch with direct electrons, due to the enhancement of the electron-electron interaction; said interaction occurring between indirect electrons injected over the indirect spike and said direct electrons which already exist in the direct notch; said avalanche filling being produced when a critical value of the notch electron population is exceeded; the switching from said fast mechanism to said slow mechanism being effected by emptying of said direct notch due to the attenuation of said electron-electron interaction, said emptying being produced when said notch electron population decreases below a critical value; and
circuiting means for biasing said p-n heterojunction and coupling it with a load with a variable external voltage so that a current-voltage characteristic which exhibits two branches, the OFF branch and the ON branch, and a hysteresis loop is produced, the operating point being on said OFF branch of the current-voltage characteristic, when a critical point ON is exceeded, determined by a critical voltage level ON and by a critical level ON, the latter levels being correlated with an increase of said notch electron population over a critical value, the device switches on said ON branch of the current-voltage characteristic; the operating point being on said ON branch of the current-voltage characteristic and decreasing the bias, when a critical point OFF, determined by a critical voltage level OFF and a critical current level OFF is exceeded, the latter levels being correlated with a decrease of said notch electron population below a critical valve, the device switches on said OFF branch of the current-voltage characteristic; said hysteresis loop being defined by said two branches of the current-voltage characteristic and by two load lines which pass through said ON and OFF critical points.

2. A semiconductor device according to claim 1, wherein the p-type region and n-type region have close doping levels.

3. A semiconductor device according to claim 2, wherein the doping levels are below $10^{16}$ cm$^{-3}$.

4. A semiconductor device according to claim 3, wherein there is an abrupt transition from the p-type region to the n-type region and there are no interface states.

5. A semiconductor device according to claim 3, wherein energy difference between the direct and indirect conduction band minima of the p-type semiconductor is small enough to assure the mixing of both band wave functions in order to describe the localized states.

6. A semiconductor device according to claim 5, wherein the n-type and p-type regions are made of semiconductor materials belonging to III$_x$III'$_{1-x}$V or III V$_x$V'$_{1-x}$ families, which can be direct or indirect materials depending on composition.

7. A semiconductor device according to claim 6, wherein the n-type region is made of indirect Al$_x$Ga$_{1-x}$As, with $x > 0.37$, and the p-type region is made of direct Al$_y$Ga$_{1-y}$As, with $y < 0.37$.

8. A bistable memory-effect semiconductor device comprising a semiconductor material body containing a p-n heterojunction between the p-type and n-type regions; the n-type region is made of a n-type indirect gap material and the p-type region is made of a p-type direct gap material; the indirect gap of said n-type material is wider than that indirect gap of said p-type material at corresponding position in wavevector space; the indirect gap conduction band minima in said n-type material are higher in energy than the corresponding indirect gap conduction band minima in said p-type material, at said p-n heterojunction; said heterojunction exhibits a spike-notch structure in the indirect gap conduction band minima and a spike-notch structure in the direct gap conduction band minima; said heterojunction affording two mechanisms for electron flow from said n-type region to the p-type region, including a slow mechanism and a fast mechanism; the switching from said slow mechanism to said fast mechanism being done by avalanche filling of the direct notch with direct electrons due to the enhancement of the electron-electron interaction; said interaction occurring between indirect electrons injected over the indirect spike and said direct electrons which already exist in the direct notch; said avalanche filling being produced when a critical value of the notch electron population is exceeded; the switching from said fast mechanism to said slow mechanism being done by emptying of said direct notch due to attenuation of said electron-electron interaction, said emptying being produced when said notch electron population decreases below a critical value; and circuit means for biasing said p-n heterojunction coupled with a load with a fixed external voltage so that to said fixed voltage correspond two stable states, OFF and ON, whose operating points are situated on the OFF, respectively ON, branches of the current-voltage characteristic; said circuit means applying voltage pulses of predetermined amplitude and polarity; whereby when a pulse having the same polarity as the fixed voltage is applied so that the total voltage applied to the heterojunction exceeds a critical point ON, correlated with increasing of said notch electron population over a critical value, the device switches from said OFF state to said ON state; and whereby when a pulse of inverse polarity compared with fixed voltage is applied so that the total voltage applied to said heterojunction decreases below a critical point OFF, correlated with a decrease of said notch electron population below a critical value, the device switches from the ON state to the OFF state.

9. A semiconductor device according to claim 8, wherein the n-type region and p-type region have close doping levels.

10. A semiconductor device according to claim 9, wherein doping levels are below $10^{16}$ cm$^{-3}$.

11. A semiconductor device according to claim 10, wherein there is an abrupt transition from the p-type region to the n-type region and there are no interface states.

12. A semiconductor device according to claim 10, wherein energy difference between the direct and indirect conduction band minima of p-type semiconductor is small enough to assure the mixing of both bands wave functions in order to describe the localized states.

13. A semiconductor device according to claim 12, wherein the n-type, and p-type regions are made of semiconductor materials belonging to III$_x$III'$_{1-x}$V or III V$_x$V'$_{1-x}$ families which can be direct or indirect materials depending on composition.

14. A semiconductor device according to claim 13, wherein the n-type region is made of indirect Al$_x$Ga$_{1-x}$As, with $x>0.37$. and the p-type region is made of direct Al$_y$Ga$_{1-y}$As, with $y<0.37$.

15. A bistable memory-effect semiconductor device comprising a semiconductor material body containing a p-n heterojunction and a p-n junction; said heterojunction and said junction having a common p-type region forming a base; said p-n heterojunction being made of two p-type and n-type regions, the n-type region is made of a n-type indirect gap material and the p-type region is made of a p-type direct gap material; the indirect gap of said n-type material is wider than that indirect gap of said p-type material at the corresponding position in wavevector space; the indirect gap conduction band minima in said n-type material are higher in energy than the corresponding indirect gap conduction band minima in said p-type material, at said p-n heterojunction; said heterojunction exhibits a spike-notch structure in the indirect gap conduction band minima and a spike notch structure in the direct gap conduction band minima; said p-n junction allowing direct electron injection in the p-n heterojunction direct notch; said heterojunction providing two mechanisms for electron flow from the n-type region to the p-type region including a slow mechanism and a fast mechanism; the switching from said slow mechanism to said fast mechanism being done by avalanche filling of the direct notch with direct electrons due to the enhancement of the electron-electron interaction; said interaction occurring between indirect electrons injected over the indirect spike and said direct electrons which already exist in the direct notch; said avalanche filling being produced when a critical value of the notch electron population is exceeded; said notch electron population being controlled by current flow through the p-n heterojunction and mainly by direct electrons injected from the p-n junction; the switching from said fast mechanism to said slow mechanism being done by emptying of said direct notch due to attenuation of said electron-electron interaction; said emptying is produced when said notch electron population decreases below a critical value; said notch electron populating being controlled in this case also by current flow through p-n heterojunction and mainly by direct electrons injected from the p-n junction;

circuit means for biasing said p-n heterojunction coupled with a load with a fixed external voltage; said circuit means including means for passing control current through said p-n junction; and wherein to said fixed voltage and to said load correspond two stable states ON and OFF; when a critical value ON of the control current, corresponding to said fixed voltage of said load and correlated with a critical value of direct notch electron population, is exceeded, said p-n heterojunction switches to the state ON; and when the control current decreases below a critical value OFF, corresponding to said fixed voltage and said load and correlated with a critical value of direct notch electron population, the p-n heterojunction switches to state OFF.

16. A semiconductor device according to claim 15, wherein the p-type and n-type regions of said heterojunction have close doping levels.

17. A semiconductor device according to claim 16, wherein the doping levels of the p-type and n-type regions of the heterojunction are below $10^{16}$ cm$^{-3}$.

18. A semiconductor device according to claim 17, wherein there is an abrupt transition from the p-type region to the n-type region and there are no interface states.

19. A semiconductor device according to claim 17, wherein said base is narrow compared with the diffusion length of direct electrons.

20. A semiconductor device according to claim 19, wherein the energy difference between the direct and indirect conduction band minima of the p-type semiconductor is small enough to assure the mixing of both bands wave functions in order to describe the localized states.

21. A semiconductor device according to claim 20, wherein the n-type and p-type regions of the heterojunction are made of semiconductor materials belonging to $III_xIII'_{1-x}V$ or $III V_xV'_{1-x}$ families, which can be direct or indirect materials depending on composition.

22. A semiconductor device according to claim 21, wherein the n-type region of the heterojunction is made of indirect $Al_xGa_{1-x}As$, with $x>0.37$, and the p-type region of the heterojunction is made of direct $Al_yGa_{1-y}As$, with $y<0.37$.

23. A bistable memory-effect semiconductor device comprising a semiconductor material containing a p-n heterojunction; said heterojunction being made of two n-type and p-type regions; the n-type region is made of a n-type indirect gap material and the p-type region is made of a p-type direct gap material; the indirect gap of said n-type material is wider than that indirect gap of said p-type material at the corresponding position in wavevector space; the indirect gap conduction band minima in said n-type material are higher in energy than the corresponding indirect gap conduction band minima in said p-type material, at said p-n heterojunction; said heterojunction exhibits a spike-notch structure in the indirect gap conduction band minima and a spike-notch structure in the direct gap conduction band minima; said heterojunction providing two mechanisms for electron flow from the n-type region to the p-type, including a slow mechanism and a fast mechanism; the switching from said slow mechanism to said fast mechanism being done by avalanche filling of the direct notch with direct electrons due to the enhancement of the electron-electron interaction; said interaction occurring between indirect electrons injected over the indirect spike and said direct electrons which already exists in the direct notch; said avalanche filling being produced when a critical value of the notch electron population is exceeded; said notch electron population being controlled by the current flow through the p-n heterojunction and mainly by the direct electrons generated by absorption of radiation having a predetermined wavelength; the switching from said fast mechanism to said slow mechanism being done by emptying of said direct notch due to attenuation of said electron-electron interaction; said emptying being produced when said notch electron population decreases below a critical value; said notch electron population being controlled in part by current flow through the p-n heterojunction and mainly by direct electrons optically generated in the notch region;

circuit means for biasing said p-n heterojunction coupled with a load with a fixed external voltage; and optical means in order to generate electrons in the direct notch; wherein: to said fixed voltage and said load corresponds two stable states ON and OFF; when a critical value ON of the control luminous flux, corresponding to said fixed voltage and said load and correlated with a critical value of direct notch electron population, is exceeded, said p-n heterojunction switches to the state ON; when the control luminous flux decreases below a critical value OFF, corresponding to said fixed voltage and said load and correlated with a critical value of direct notch electron population, the p-n heterojunction switches to state OFF.

24. A semiconductor device according to claim 23, wherein the p-type and the n-type regions of said heterojunctions have close doping levels.

25. A semiconductor device according to claim 24, wherein the doping levels of the p-type and n-type regions are under $10^{16}$ $cm^{-3}$.

26. A semiconductor device according to claim 25, wherein there is an abrupt transition from the p-type region to the n-type region and there are no interface states.

27. A semiconductor device according to claim 26, wherein the energy difference between the direct and indirect conduction band minima of the p-type semiconductor is small enough to assure the mixing of both bands wave functions in order to describe the localized state.

28. A semiconductor device according to claim 27, wherein the control luminous flux having a convenient wavelength can arrive in the notch region the n region by a window effect.

29. A semiconductor device according to claim 27, wherein the n-type and p-type regions are made of semiconductors materials belonging to $III_xIII'_{1-x}V$ or $III V_xV'_{1-x}$ families, which can be direct or indirect materials depending on composition.

30. A semiconductor device according to claim 29, wherein the n-type region is made of indirect $Al_xGa_{1-x}As$, with $x >0.37$, and the p-type region is made of direct $Al_yGa_{1-y}As$, with $y <0.37$.

31. A semiconductor device according to claim 8, wherein the p-type material of said heterojunction is so chosen that the OFF and ON states are optically displayed by light emission due to radiative recombination in the p-type region.

32. A semiconductor device according to claim 31, wherein the light emitted in the p-type region passes through the n-type region of the heterojunction by a window effect.

33. A semiconductor device according to claim 8, wherein said circuit means includes photodetectors so that it exhibits electrical isolation between the input and the output.

34. A semiconductor device according to claim 33, wherein the radiation emitted pass through the n-type region by window effect.

35. A semiconductor device according to claim 15, wherein said circuit means is connected in a feedback configuration to generate electromagnetic oscillations.

36. A semiconductor device according to claim 15, wherein the p-type material of said heterojunction is so chosen that the OFF and ON states are optically displayed by light.

37. A semiconductor device according to claim 36, wherein the light emitted in the p-type region passes through the n-type region of the heterojunction by a window effect.

38. A semiconductor device according to claim 15, wherein said circuit means includes photodetectors so that it exhibits electrical isolation between the input and the output.

39. A semiconductor device according to claim 38, wherein the radiation emitted pass through the n-type region by window effect.

40. A semiconductor device according to claim 23, wherein the p-type material of said heterojunction is so chosen that the OFF and ON states are optically displayed by light emission due to radiative recombination in the p-type region.

41. A semiconductor device according to claim 40, wherein the light emitted in the p-type region passes through the n-type region of the heterojunction by a window effect.

42. A semiconductor device according to claim 23, wherein said circuit means includes photodetectors so that it exhibits electrical isolation between the input and the output.

43. A semiconductor device according to claim 42, wherein the radiation emitted pass through the n-type region by window effect.

* * * * *